United States Patent [19]
Cowles et al.

[11] Patent Number: 5,508,638
[45] Date of Patent: Apr. 16, 1996

[54] LOW CURRENT REDUNDANCY FUSE ASSEMBLY

[75] Inventors: Timothy B. Cowles; Steven G. Renfro, both of Boise, Id.

[73] Assignee: Micron Technology, Inc., Boise, Id.

[21] Appl. No.: 452,203

[22] Filed: May 26, 1995

Related U.S. Application Data

[63] Continuation of Ser. No. 201,432, Feb. 24, 1994, Pat. No. 5,424,672.

[51] Int. Cl.$^6$ ................ H03K 19/003; H03K 19/173
[52] U.S. Cl. .................. 326/38; 326/10; 327/525
[58] Field of Search .............. 326/10, 38; 327/525

[56] References Cited

U.S. PATENT DOCUMENTS

| | | | |
|---|---|---|---|
| 4,689,494 | 8/1987 | Chen et al. | 32/38 |
| 4,791,319 | 12/1988 | Tagami et al. | 327/525 |
| 4,847,810 | 7/1989 | Tagami | 327/525 |
| 5,059,835 | 10/1991 | Lauffer et al. | 326/38 |
| 5,099,149 | 3/1992 | Smith | 326/38 |
| 5,424,672 | 6/1995 | Cowles et al. | 326/38 |

*Primary Examiner*—Edward P. Westin
*Assistant Examiner*—Richard Roseen
*Attorney, Agent, or Firm*—Henri J. A. Charmasson; John D. Buchaca

[57] ABSTRACT

In a microcircuit device such as a memory chip, where a bank of fuse-controlled latch pulse routing-circuits are used to program redundant circuits or other programming options with every memory cycle or multiple thereof, the amount of current drawn by every fuse-control circuit is reduced by controlling each bank of circuits with a bank-enabling, fuse-programmed circuit between the latch pulse source and the bank of fuse-controlled programing circuits, and by adding a second fuse into each programing circuit; whereby, the bank of programing circuits can be enabled by alternately blowing one of two fuses in the bank-enabling circuit, and each programming logic can set by alternately blowing one of its pair of fuses thus cutting off any current path through the programing circuit regardless of the programing state of the circuit.

10 Claims, 1 Drawing Sheet

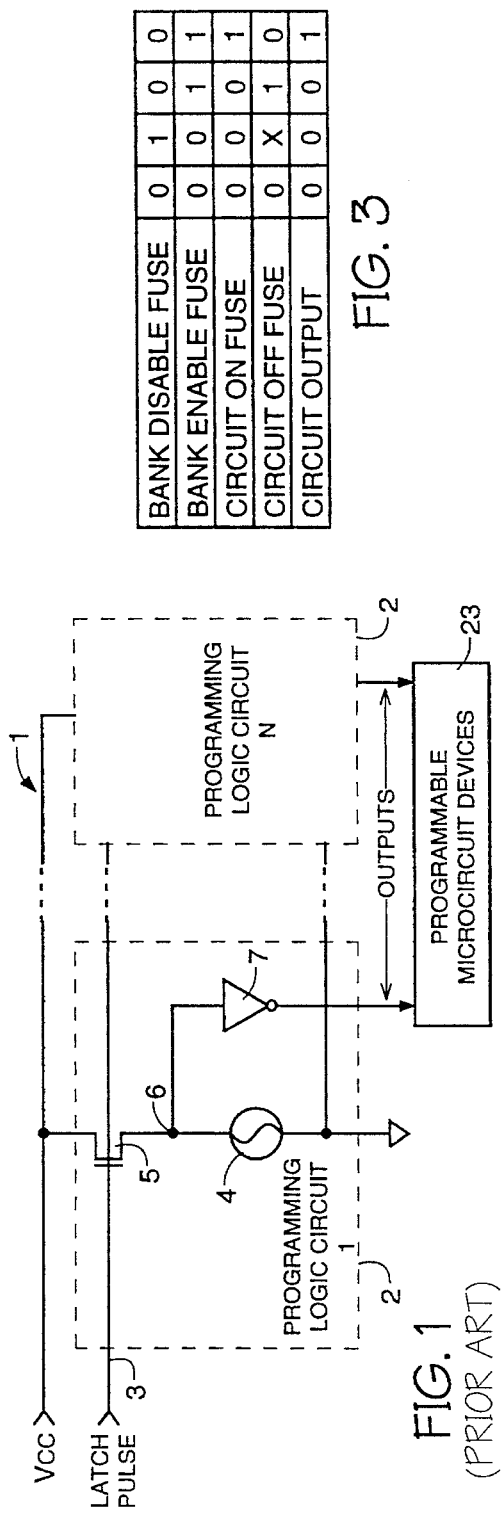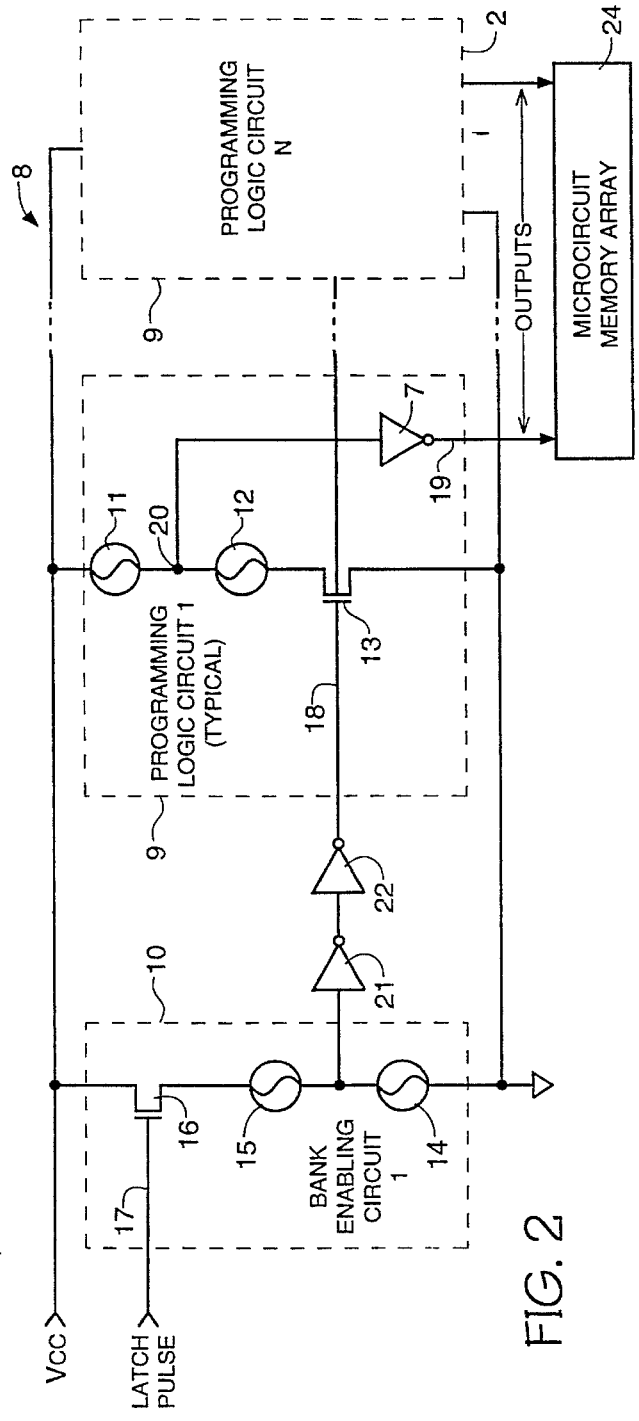

LOW CURRENT REDUNDANCY FUSE ASSEMBLY

PRIOR APPLICATION

This is a continuation of Ser. No. 08/201,432 filed Feb. 24, 1994, now U.S. Pat. No. 5,424,672.

FIELD OF THE INVENTION

This invention relates to the testing of microelectronic modules, and more specifically to the use of fuse-controlled enabling or disabling logic circuits such as the ones used to disable a portion of a memory array found to be defective during wafer-level testing.

BACKGROUND OF THE INVENTION

Semiconductor integrated circuits contain large numbers of electronic components such as diodes and transistors built on a single chip. Due to the microscopic scale of these circuits, they are susceptible to component defects due to material impurities and fabrication hazards.

In order to circumvent this problem, redundant components and/or circuits are built on every chip that can be switched-in in lieu of corresponding circuits found defective during testing. Usually the switching-out of a defective component or circuit and the switching-in of a corresponding redundant element is accomplished by using programming logic circuits which are activated by blowing certain fuses built into the chip circuitry.

FIG. 1 illustrates a typical fuse-controlled programing circuit of the prior art.

A bank 1 of N programming logic circuits 2 is interrogated by a latch pulse appearing on a latch pulse line 3 connected to control terminals of the logic circuits 2. Each programing logic circuit comprises a fuse 4 wired in series with a switching transistor 5 between a supply voltage VCC and its ground reference. The node 6 between the fuse and the switching transistor is wired into the input-of a driver 7. The output of the driver is typically used to set a latching circuit which disables the defective circuit and enables a substitute from the redundant circuit bank. The latch pulse is allowed to pass through the programming logic circuit 2 only after the fuse 4 has been blown. So long as the fuse 4 short-circuits the node 6 to the reference ground the output of the driver 7 remains high regardless of the presence of the latch pulse on its control terminal. It should be noted that as long as the fuse 4 remains intact, current is drawn through it and through the switching transistor 5 during the period of every latch pulse. This type of programming logic circuit is commonly used in connection with memory chips wherein a latch pulse is usually issued with every memory cycle. As more programming logic circuits of this type are placed on a wafer and not programmed by blowing their fuses, the cumulative current drawn with every latch pulse occurring with every memory cycle can be significant and enough to affect the operation of the microcircuit.

A common solution found throughout the prior art to this problem is to pulse the programming logic circuit, i.e., issue a latch pulse, only once upon powering up the chip in order to latch-in the proper redundancy scheme or other control option. However, pulsing the circuits during the power up cycle does not guarantee that the proper redundancy or other option then set will not be unlatched sometime later during the operation of the chip as a result of a-power surge, background noise or other form of transient. Without any other pulsing of the programming logic circuit until the next power up, there is no way the circuit can correct itself in such cases of spurious unlatching. Moreover, there is never any guarantee that the correct program can be latched-in with one single initial pulse. It is therefore preferable to issue a latch pulse with every memory cycle or multiples thereof to assure, not only a correct original latching-in of the programming scheme, but also an automatic correction of any spurious malfunction.

Accordingly, there is a need to find a palliative to the excessive drawing of current by banks of such programming logic circuits used to latch-in redundancy circuits and other programming options.

SUMMARY OF THE INVENTION

The principal and secondary objects of this invention are to improve the performance of microcircuits that use fuse-controlled programming circuits to latching-in redundancy circuits and other programming options, by limiting the amount of current drawn through each unblown fuses; and to do so without limiting the frequency of the latching-in cycle, in connection, in particular, with memory chips wherein large arrays of identical components are prone to be backed up by several columns or rows of redundant circuits which are preferably programmed with every memory cycle. These and other objects are achieved by adding a fuse-controlled enabling circuit for every bank of latch-programming circuits, and adding a second fuse to every fuse-controlled circuit in the bank; whereby the bank can be enabled or disabled, and the logic circuit can be programmed by blowing either one of the pair of fuses associated with each circuit. Since one of the fuses is always blown, the current flow through the remaining fuses is stopped or considerably reduced no matter how the circuit is programmed.

BRIEF DESCRIPTION OF THE DRAWING

FIG. 1 illustrates a bank of programing logic circuits for rout latching pulse according to the prior art;

FIG. 2 is a schematic of a latching pulse-routing circuit according to the invention; and FIG. 3 is a logic truth-table of the latch pulse routing circuit operation.

DESCRIPTION OF THE PREFERRED EMBODIMENT OF THE INVENTION

Referring now to the drawing, there is shown in FIG. 2 an improved version 8 of the bank of N programing logic circuits illustrated in FIG. 1 used in connection with a programmable microcircuit device 23 such as a memory array 24. The improvement consists essentially in adding an extra one to the bank of programming logic circuits 9 to act as a bank-enabling circuit 10, of adding to each original blowable fuse 11 in each programming logic circuit 9 a second fuse 12 between the-switching transistor 13 and the original fuse 11, and of adding to a first fuse 14 of the bank-enabling circuit 10 a second fuse 15 wired between the switching transistor 16 and the first fuse 14. The latch pulse line 17 is routed through the bank-enabling circuit 10 by connecting its source to a controlling input of the bank-enabling circuit transistor 16, then connecting the junction between the two fuses 14, 15 of the bank-enabling circuit to each of the controlling input terminals 18 of the switching transistor 13 in each programming logic circuit 9. The output signal 19 of each programming logic circuit is derived from the junction 20 between the two fuses 11, 12 at which the Voltage is indicative of the status of those fuses in accordance with the truth-table illustrated in FIG. 3. In the truth-table, a "0" indicates that the fuse is intact, and a "1" stands for a blown fuse. In the output, "0" means that no latch-pulse signal is transmitted (ON condition), and a 37 1" indicates the free transit of the latch-pulse (OFF condition). The bank-enabling circuit 10 as well as each of the programming logic circuits 9 must be set by alternately blowing either one of the pair of fuses in each circuit. It should be noted however, that if none of the bank-enabling circuit fuses 14, 15 are blown, the result is similar as having blown only the bank-disabling fuses 15, i.e., outputs 19 will remain in the OFF state. It should also be noted that if the bank-disable fuse 15 is blown, it does not matter whether the OFF-fuse 12 of each programming logic circuit is blown or not, the outputs 19 are always disabled. However, if both the bank disable fuse 15 and the ON-fuse 11 are blown the circuit will not work because node 20 will be in an undetermined state. When the bank-enable fuse 14 is blown, then the status of the output will be ON if the ON-fuse 11 has been blown, but would be OFF if the OFF-fuse 12 has been blown.

Although, in FIG. 2, the location of the bank-enabling circuit fuses 14, 15 in relation to the switching transistor 16 is opposite to the position of the fuses 11, 12 in relation to the switching transistor 13 in the programming logic circuits, the former position can be inverted and one of the drivers 21, 22 suppressed without affecting the logic operation of the circuits. It should also be understood that while the programming logic circuits and the bank-enabling circuits are illustrated in a simplified form wherein the fuses are wired directly in series with the switching transistors, the same concept of adding a bank-enabling circuit combined with the addition of second fuses to the programming logic circuits could be applied to other circuits wherein the blowable fuses are not necessarily in series with a switching transistor. For example, a resistor or any other type of device capable of feeding or transmitting current into the fuses could be used in lieu of a transistor. Thus, various equivalents of the above-described embodiment of the invention can be devised by people skilled in the electronic arts following the basic principle underlying this invention that calls for blowing one of the two serially connected fuses in all cases in order to cut off the current path through any unblown fuse.

While the preferred embodiment of the invention has been described, modifications can be made and other embodiments may be devised without departing from the spirit of the invention and the scope of the appended claims.

What is claimed is:

1. A bank of programming logic circuits for enabling and disabling elements of an array of microcircuit devices, wherein each of said programming logic circuits comprises:

first and second fuses and a switching transistor wired in series, each of said fuses having a status;

and means for detecting the status of said fuses, said means for detecting comprising an output signal taken at a point between said first and second fuses.

2. The bank of claim 1, wherein said means for detecting further comprise:

a first pole of a supply voltage;

a second pole of said supply voltage; and a control line;

wherein said switching transistor has a first current-carrying terminal connected to said first pole, a second current-carrying terminal wired to a first terminal of said first fuse, and a control terminal wired to said control line.

3. The bank of claim 2, wherein a second terminal of said second fuse is wired to said second pole.

4. The bank of claim 3, wherein said point is wired to a second terminal of said first fuse and a first terminal of said second fuse.

5. A bank of programming logic circuits for enabling and disabling elements of an array of microcircuit devices, wherein each of said programming logic circuits comprises:

first and second fuses wired in series, each of said fuses having a status;

and means for detecting the status of said fuses, said means for detecting comprising:

an output signal taken at a point between said first and second fuses;

a first pole of a supply voltage;

a second pole of said supply voltage;

a control line;

switching means, responsive to a first signal appearing on said control line, for applying a voltage appearing on said first pole to a first terminal of said first fuse;

wherein said switching means comprise a switching transistor having a first current-carrying terminal connected to said first pole, a second current-carrying terminal wired to said first terminal of said first fuse, and a control terminal wired to said control line;

wherein a second terminal of said second fuse is wired to said second pole;

wherein said point is wired to a second terminal of Said first fuse and a first terminal of said second fuse; and wherein each of said logic circuits further comprises a programming driver having an input connected to said point.

6. A circuit for enabling and disabling elements of a microcircuit array comprises:

a plurality of programming logic circuits;

a bank enabling circuit;

a latch pulse source;

a supply voltage source;

a circuit ground reference;

wherein said bank enabling circuit comprises:

a bank output line;

a first bank fuse, having a first terminal and a second terminal;

a second bank fuse, having a first terminal and a second terminal;

a bank switching transistor having a first current-carrying terminal, a second current-carrying terminal and a control terminal;

wherein said first terminal of said bank transistor is connected to said supply voltage source;

said second terminal of said bank transistor is connected to said first terminal of said first bank fuse;

said control terminal of said bank transistor is connected to said latch pulse source;

said second terminal of said first bank fuse is connected to said first terminal of said second bank fuse;

said second terminal of said second bank fuse is connected to said ground reference;

said bank output line is connected to said second terminal of said first bank fuse;

wherein each of said programming logic circuits comprises:

a control input line connected to said bank output line;
a status output line;
a first fuse, having a first terminal and a second terminal;
a second fuse, having a first terminal and a second terminal;
a switching transistor having a first current-carrying terminal, a second current-carrying terminal and a control terminal;
wherein said first terminal of said first fuse is connected to said supply voltage source;
said second terminal of said first fuse is connected to said first terminal of said second fuse;
said second terminal of said second fuse is connected said first terminal of said switching transistor;
said second terminal of said switching transistor is connected to said ground reference;
said control input line is connected to said control terminal of said switching transistor;
and said status output line is connected to second terminal of said first fuse.

7. The circuit of claim 6, wherein each of said logic circuits further comprises a programming driver having an input connected to said status output line.

8. The circuit of claim 6, wherein said bank enabling circuit further comprises a current driver having an input terminal connected to said bank output line and an output terminal connected to each of said programming logic circuits.

9. The circuit of claim 6, wherein each of said programming logic circuits is connected to an array of microcircuit devices.

10. The circuit of claim 6, wherein each of said programming logic circuits is connected to a microcircuit memory array.

* * * * *